(12) United States Patent
Kubota et al.

(10) Patent No.: US 8,030,176 B2
(45) Date of Patent: Oct. 4, 2011

(54) METHOD FOR PREPARING SUBSTRATE HAVING MONOCRYSTALLINE FILM

(75) Inventors: Yoshihiro Kubota, Annaka-Shi (JP); Makoto Kawai, Gunma-ken (JP); Kouichi Tanaka, Gunma-ken (JP); Yuji Tobisaka, Gunma-ken (JP); Shoji Akiyama, Gunma-ken (JP); Yoshihiro Nojima, Gunma-ken (JP)

(73) Assignee: Shin-Etsu Chemical Co., Ltd. (JP)

( * ) Notice: Subject to any disclaimer, the term of this patent is extended or adjusted under 35 U.S.C. 154(b) by 56 days.

(21) Appl. No.: 12/380,090

(22) Filed: Feb. 24, 2009

(65) Prior Publication Data

US 2009/0221131 A1 Sep. 3, 2009

(30) Foreign Application Priority Data

Feb. 29, 2008 (JP) ................... 2008-050187
Feb. 10, 2009 (JP) ................... 2009-028783

(51) Int. Cl.
*H01L 21/46* (2006.01)
(52) U.S. Cl. ......................... 438/458; 438/455
(58) Field of Classification Search .................. 438/455, 438/458
See application file for complete search history.

(56) References Cited

U.S. PATENT DOCUMENTS 7,767,547 B2 * 8/2010 Isaka et al. .................... 438/458

FOREIGN PATENT DOCUMENTS

EP 0843344 A1 5/1998
JP 2004-048076 A 2/2004

OTHER PUBLICATIONS

European Search Report, EP 09250519, dated Jun. 15, 2009.

* cited by examiner

*Primary Examiner* — Bradley K Smith
(74) *Attorney, Agent, or Firm* — Lerner, David, Littenberg, Krumholz & Mentlik, LLP

(57) ABSTRACT

Provided is a method for easily preparing a substrate comprising a monocrystalline film thereon or thereabove with almost no crystal defects without using a special substrate. More specifically, provided is a method for preparing a substrate comprising a monocrystalline film formed on or above a handle substrate, the method comprising: a step A of providing a donor substrate and the handle substrate; a step B of growing a monocrystalline layer on the donor substrate; a step C of implanting ions into the monocrystalline layer on the donor substrate so as to form an ion-implanted layer; a step D of bonding a surface of the monocrystalline layer of the ion-implanted donor substrate to a surface of the handle substrate; and a step E of peeling the bonded donor substrate at the ion-implanted layer existing in the monocrystalline layer so as to form the monocrystalline film on or above the handle substrate; wherein at least the steps A to E are repeated by using the handle substrate having the monocrystalline film formed thereon or thereabove as a donor substrate.

16 Claims, 2 Drawing Sheets

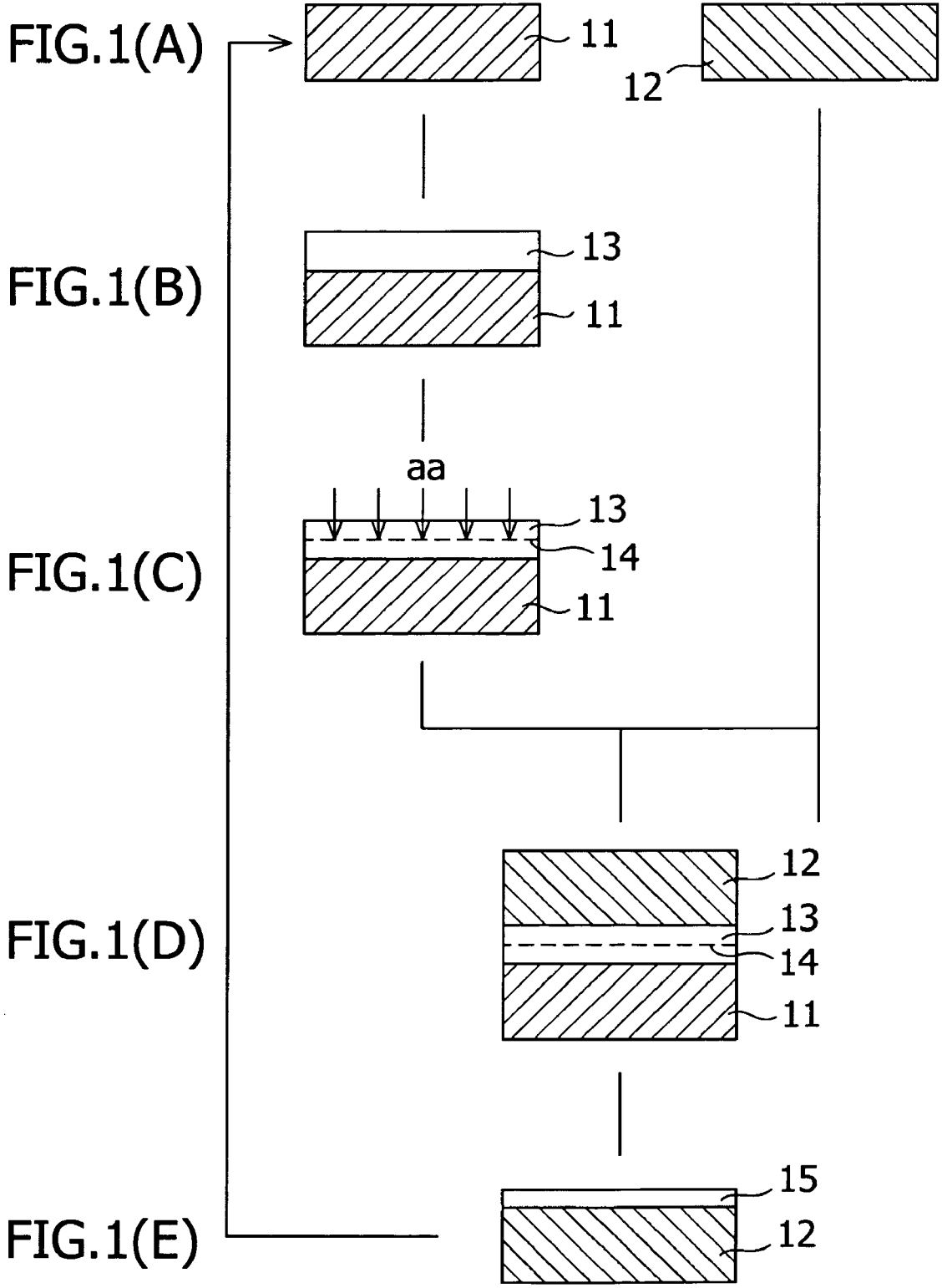

METHOD FOR PREPARING SUBSTRATE HAVING MONOCRYSTALLINE FILM

BACKGROUND OF THE INVENTION

1. Field of the Invention

The present invention relates to a method for preparing a substrate having a monocrystalline film with few crystal defects.

2. Description of the Related Art

Importance for monocrystalline films and substrates formed of silicon, SiC, GaN, AlN, zinc oxide, diamond or the like used in semiconductor devices such as power transistors, lasers, LEDs and high-frequency elements, has been more and more increasing.

Typically, a monocrystalline film is prepared by growing a film by vapor phase epitaxial, liquid phase epitaxial, sputtering, EB, MBE, PVD such as sublimation or the like on a monocrystalline substrate selected from for example, silicon, sapphire, SiC or the like having a lattice constant close to that of the monocrystalline film.

On the other hand, the substrates used in these examples are generally prepared by bulk crystal growth in an FZ method, a CZ method, a sublimation method or the like using a seed crystal, followed by slicing, polishing or the like.

However, the monocrystalline film or the substrate obtained by such conventional methods has disadvantages in that dislocation defects in the monocrystalline substrate used as a seed substrate are succeeded, or crystal strain or a lamination defect caused by mismatching of the lattice constant or the coefficient of thermal expansion, or crystal defect such as micro-pipe is apt to occur easily. The dislocation defects mean the disorder of periodicity of atoms in the crystal.

Since a large number of these crystal defects have an adverse effect on the initial properties and the long-term reliability of a device, the crystal defects of the monocrystalline film or the substrate to be used have to be as few as possible in order to prepare a semiconductor device having high performance and high reliability.

Therefore, conventionally, in order to decrease the number of crystal defects, an extremely expensive monocrystalline silicon having nearly no crystal defects (near perfect crystal) has been used. Alternatively, a number of buffer layers are formed between a monocrystalline substrate and a monocrystalline film to be grown. The buffer layers such as layers of $SiO_2$, silicon, GaN, AlGaN, InGaN or GaAs, which have middle values of the lattice constant and the coefficient of thermal expansion between those of the monocrystalline substrate and the monocrystalline film to be grown, are formed on the monocrystalline substrate and followed by growth of the monocrystalline film on the surface of the buffer layers (see JP 2004-048076A).

However, these improvements require high material costs and process costs and are economically disadvantageous. There is concern over safety and health matters and the reduction of crystal defects is insufficient. Accordingly, they are not practical.

SUMMARY OF THE INVENTION

Taking the above problems into consideration, it is an object of the present invention to provide a method for easily preparing a substrate having few crystal defects especially without using a special substrate; and to provide methods for preparing a monocrystalline layer, a monocrystalline film and a monocrystal, each having few crystal defects by epitaxial growth or bulk crystal growth using said substrate as a seed substrate.

To achieve the above object, the present invention provides a method for preparing a substrate comprising a monocrystalline film formed on or above the substrate which is a handle substrate, the method comprising:

a step A of providing a donor substrate and the handle substrate;

a step B of growing a monocrystalline layer on the donor substrate;

a step C of implanting ions into the monocrystalline layer on the donor substrate so as to form an ion-implanted layer;

a step D of bonding a surface of the monocrystalline layer of the ion-implanted donor substrate to a surface of the handle substrate; and a step E of peeling the bonded donor substrate at the ion-implanted layer existing in the monocrystalline layer so as to form the monocrystalline film on or above the handle substrate;

wherein at least the steps A to E are repeated by using the handle substrate having the monocrystalline film formed thereon or thereabove as a donor substrate.

According to the preparation method of the present invention, the upper layer portion of the monocrystalline layer formed on a donor wafer is transferred as a monocrystalline film to a handle wafer. The upper layer portion is resistant to the effect of defects on the surface of the donor wafer and has few crystal defects. Furthermore, because in turn the handle wafer is used as a donor wafer and a monocrystalline layer is grown on the monocrystalline film having few crystal defects, the formed monocrystalline layer has further fewer crystal defects than the monocrystalline layer formed in the previous step. By repeating such steps (A to E), crystal defects in the monocrystalline film formed on the donor wafer are further reduced, and finally, a substrate having a uniform monocrystalline layer with extremely few crystal defects can be obtained.

According to the preparation method of the present invention, since no especially expensive substrate is required to be prepared and no special process is required to be carried out for preparing a substrate having a monocrystalline film with few crystal defects, a substrate having a monocrystalline film with few crystal defects can be easily prepared at a low cost.

The present invention is also provides a method for preparing a substrate comprising a monocrystalline layer thereon, comprising a step of growing a monocrystalline layer on a monocrystalline film on the substrate prepared in the method for preparing a substrate comprising a monocrystalline film of the present invention.

Since the monocrystalline film of the substrate prepared by the method of the present invention has extremely few crystal defects, when a monocrystalline layer is grown on the monocrystalline film, defects or the like caused by the effect of the surface of the substrate above which the monocrystalline layer will be grown can be prevented. Accordingly, a monocrystalline layer having a desired thickness with few crystal defects can be formed.

The present invention provides a method for preparing a self-sustained monocrystalline film, comprising steps of:

implanting ions into the monocrystalline layer of the substrate prepared in the method for preparing a substrate comprising a monocrystalline layer thereon of the present invention so as to form an ion-implanted layer, and peeling at the ion implanted layer to obtain a self-sustained monocrystalline film.

When a part of a thick monocrystalline layer on the substrate having the thick monocrystalline layer prepared in the method of the present invention is peeled to have a predetermined thickness by using an ion implantation method, a self-sustained monocrystalline film having few crystal defects and a high smoothness can be prepared.

The present invention provides a method for preparing a monocrystal, comprising a step of using the substrate comprising a monocrystalline film, the substrate comprising a monocrystalline layer, or the self-sustained monocrystalline film prepared in the method of the present invention as a seed substrate for epitaxial growth or bulk crystal growth.

Since the substrate comprising a monocrystalline film, the substrate comprising a monocrystalline layer, and the self-sustained monocrystalline film prepared by the method of the present invention have few or nearly zero crystal defects, when any of the substrate comprising a monocrystalline film, the substrate comprising a monocrystalline layer, or the self-sustained monocrystalline film is used as a seed substrate, very few crystal defects caused by the defects of the surface of the seed substrate occur in epitaxial growth or bulk crystal growth. Therefore, a monocrystal having very few crystal defects can be grown to have a desired thickness.

According to the method for preparing a monocrystalline film of the present invention, only the upper layer portion of the monocrystalline layer having relatively few crystal defects can be transferred as a monocrystalline film to a substrate, and by further growing a monocrystalline layer on the monocrystalline film on the substrate, the monocrystalline layer having fewer crystal defects can be formed. By thus repeating the steps of the present invention, the crystal defects in the grown monocrystalline layer can be further reduced, and finally, the crystal defects can be reduced to extremely few. Especially, a substrate comprising a monocrystalline film having nearly no crystal defects can also be prepared. In addition, when the substrate thus obtained is used as a seed substrate, occurrence of crystal defects in epitaxial growth or bulk crystal growth can be nearly eliminated.

BRIEF DESCRIPTION OF THE DRAWINGS

FIG. 1 is a flow diagram showing an example of the process for preparing a substrate comprising a monocrystalline film according to the present invention, wherein the step (A): provision of substrates, the step (B): growth of the crystalline layer, the step (C): implantation of ions ("aa" represents implantation of ions), the step (D): bonding and the step (E): peeling are exhibited.

DETAILED DESCRIPTION OF THE PREFERRED EMBODIMENTS

When a monocrystalline film or a monocrystalline substrate is prepared, there is a problem in that dislocation defects of the substrate used as a seed substrate are succeeded and crystal defects occur in the prepared monocrystalline film or the like.

The present inventors have keenly studied this problem, and found based on experiments that when a monocrystalline film is prepared, many crystal defects occur in the portion grown in the first half of growth and close to the monocrystalline substrate, while relatively a few crystal defects occur in the grown portion in the latter half of growth.

From this finding, by growing a monocrystalline layer on or above a donor substrate, forming an ion-implanted layer in the monocrystalline layer, and bonding the monocrystalline layer to the handle substrate, the upper layer portion having relatively a few crystal defects (the second half grown portion) in the monocrystalline layer can be peeled from the lower layer portion (the first half grown portion). The present inventors have found that by forming a monocrystalline film having few crystal defects on the handle substrate, using the formed substrate having the monocrystalline film as the donor substrate, and repeating the above-described steps, crystal defects in the monocrystalline film are further reduced, and finally, a monocrystalline film having an extremely few defects can be obtained; and completed the present invention.

Figure 2F:
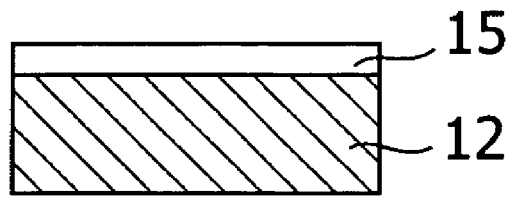
FIG. 2 is a flow diagram showing an example of the processes for preparing a substrate comprising a monocrystalline layer and for preparing a self-sustained monocrystalline film according to the present invention, wherein "aa" represents implantation of ions.
Figure 2G:
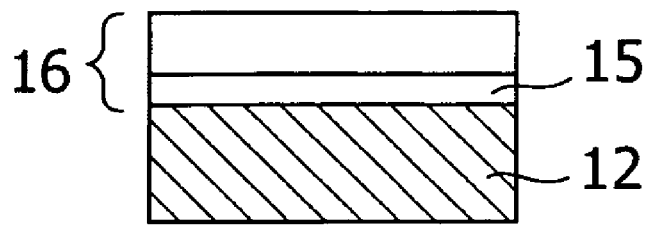
Figure 2H:
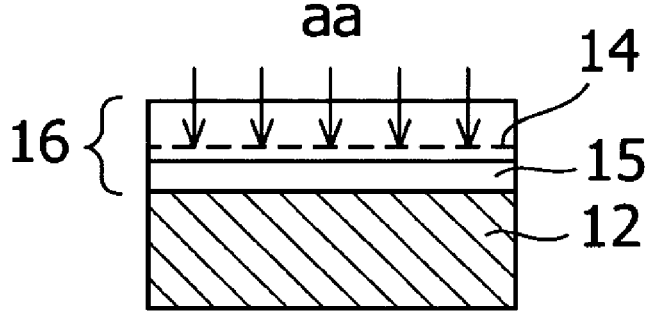
Figure 2I:
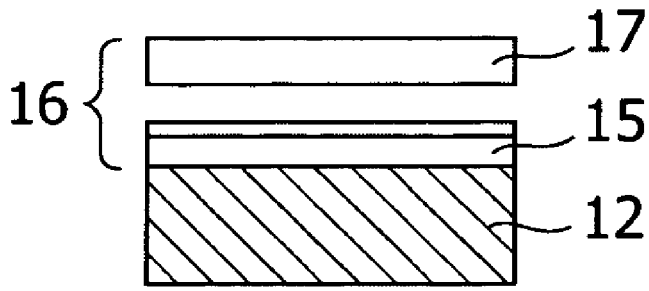

Methods for preparing a substrate comprising a monocrystalline film, a substrate comprising a monocrystalline layer, and a self-sustained monocrystalline film according to the present invention will be described below referring to FIGS. 1 and 2 as an example. However, it should not be construed that the present invention is limited thereto.

FIG. 1 is a flow diagram showing an example of the process for preparing a substrate comprising a monocrystalline film according to the present invention, wherein the step (A): provision of substrates, the step (B): growth of the crystalline layer, the step (C): implantation of ions ("aa" represents implantation of ions), the step (D): bonding and the step (E): peeling are exhibited. FIG. 2 is a flow diagram showing an example of the processes for preparing a substrate comprising a monocrystalline layer and a self-sustained monocrystalline film by using the substrate comprising the monocrystalline film obtained by the method according to the present invention, wherein "aa" represents implantation of ions.

First, in the step (A) shown in FIG. 1, a donor substrate 11 and a handle substrate 12 are provided.

The material for the donor substrate 11 or the handle substrate 12 can be any one of silicon, sapphire, SiC, GaN, AlN, and zinc oxide. In the present invention, these materials can be adequately selected corresponding to the purpose of the semiconductor device to be prepared.

Depending on the type of monocrystal to be grown, it may be preferable that at least, one of the donor substrate 11 and the handle substrate 12 comprises a buffer layer formed of $SiO_2$, $Si_3N_4$, GaN, AlGaN, InGaN, AlN or a combination thereof. When a material having a lattice constant and a coefficient of thermal expansion close to the middle values between those of the monocrystalline layer to be grown and those of the donor substrate is adequately selected from the above materials to form the buffer layer, a higher-quality monocrystalline layer can be grown. Using a substrate comprising such a buffer layer, a high-quality monocrystalline layer can be obtained and the number of repeating the steps of bonding and peeling can be reduced even when the materials of the substrate and the monocrystalline layer are different. The thickness of the buffer layer may be preferably 0.01 to 10 μm.

The handle substrate 12 to be provided can be preferably one of an amorphous substrate, a polycrystalline substrate, and a monocrystalline substrate having a surface roughness (Ra) of 0.5 nm or less. If the substrate has a surface roughness (Ra) of 0.5 nm or less, voids or the like in the bonding interface can be suppressed so that the substrates can be bonded more strongly. Since the handle substrate is not used for growing a monocrystalline layer thereon in a vapor phase, the handle substrate is not necessarily monocrystalline so that a less expensive polycrystalline substrate or amorphous substrate can also be used. The desirable surface roughness (Ra) can be obtained, for example, by etching or CMP (Chemical Mechanical Polishing).

Next, in the step (B), a monocrystalline layer 13 is grown on the donor substrate 11.

The growth can be performed by any of a chemical vapor deposition (CVD) method, a physical vapor deposition (PVD) method and a liquid phase epitaxial growth method. These methods can be adequately selected depending on the type of the monocrystalline layer to be grown. In preferred embodiments of the preparation method of the present invention, the method for growing the monocrystalline layer can be adequately selected from these methods and by using any of these methods, the number of crystal defects in the grown monocrystalline-layer can be reduced.

The monocrystalline layer 13 to be grown can be formed of any of silicon, SiC, GaN, AlN, zinc oxide and diamond. The kind of the monocrystalline layer can be adequately selected in accordance with the purpose of the semiconductor device to be prepared. Even in the case of a monocrystalline layer conventionally prone to the occurrence of crystal defects, crystal defects can be reduced according to the present invention. The thickness of the monocrystalline layer may be preferably 0.2 to 200 μm in view of the reduction of the crystal defects in a growth interface.

In the step (C), ions are implanted into the monocrystalline layer 13 formed on the donor substrate 11 to form an ion-implanted layer 14.

Hydrogen ions and/or noble gas ions are implanted into the monocrystalline layer 13 to form an ion-implanted layer (micro-foam layer) 14 parallel to the surface of the monocrystalline layer 13 at the average invading depth of ions. The implantation temperature may be preferably 25° C. to 450° C. According to the present invention, since the ion-implanted layer 14 is formed in the monocrystalline layer 13, the upper layer portion having relatively few crystal defects (second half grown portion) can be transferred to the handle substrate by peeling so as to form a monocrystalline film. The depth of implanted ions can be selected so that the desired thickness (for example, 0.1 to 100 μm) of the monocrystalline film can be obtained after peeling. In preferred embodiments of the preparation method of the present invention, ions to be implanted can be adequately selected from these ions.

In the step (D), the donor substrate 11 having the ion-implanted layer is bonded to the handle substrate 12.

It may be preferable that at least one of the surface of the monocrystalline layer 13 of the donor substrate 11 and the surface of the handle substrate is subjected to a plasma treatment before being bonded. The plasma-treated surface of the substrate is activated such that the number of OH groups is increased. Accordingly, when the substrate is closely attached to another substrate, the substrates can be bonded more strongly through hydrogen bonding and the like. In the plasma treatment, for example, the handle substrate 12 cleaned by RCA cleaning or the like is placed in a vacuum chamber, a gas for plasma is introduced therein, and the handle substrate 12 is exposed to high-frequency plasma of about 100 W for 5 to 10 minutes for the plasma treatment on the surface. The gas for plasma may include hydrogen gas, argon gas, nitrogen gas and a mixed gas thereof.

The bonded substrates can be heated (e.g. at 200 to 450° C.) because the bonding of the bonded substrates can be strengthened by heating. When a plasma treatment is performed, the substrates can be strongly bonded even by heating at a relatively low temperature (e.g. 50 to 200° C.).

Furthermore, prior to the step (D), the surface of the monocrystalline layer 13 on the donor substrate 11 may be preferably smoothened. When the surface is smooth, occurrence of voids or like in the bonding interface can be reduced so that the substrates can be strongly bonded. The method of smoothing may include, for example, polishing and annealing. When a monocrystalline silicon layer is used, for example, 1100 to 1300° C. for one to ten hours may be applied to smoothen the surface of the monocrystalline layer.

Next, in the step (E), a handle substrate 12 on which a monocrystalline film 15 is formed can be obtained by peeling at the ion-implanted layer 14. A method of peeling may include, for example, a heat treatment under an inert gas atmosphere at a temperature of about 500° C. or higher so that the substrate is separated at the ion-implanted layer by the rearrangement of crystals and the agglomeration of air bubbles. Another method of peeling may include, for example, an addition of a mechanical external force. The mechanical means for peeling may include, but not limited to, a fluid blower for blowing a fluid such as a gas or a liquid to a side of the ion-implanted layer and an impactor for applying a physical impact.

Accordingly, if the peeling step is carried out by a heat treatment or mechanical means using an ion implantation method, a substrate having a smooth peeled surface can be obtained.

Since the monocrystalline film 15 on the substrate 12 obtained by the steps (A) to (E) is formed by transferring the upper layer portion (second half grown portion) of the monocrystalline layer 13 formed on the donor substrate 11 onto the handle substrate 12, crystal defects are relatively few. In the present invention, the steps (A) to (E) are repeated in turn using the thus prepared handle substrate 12 having the monocrystalline film 15 with few crystal defects as the donor substrate. By growing a monocrystalline layer on the monocrystalline film having reduced crystal defects, a monocrystalline layer having further reduced crystal defects can be grown. Accordingly, by repeating such steps, the crystal defects of the monocrystalline film can be significantly reduced, and finally, a substrate even having a monocrystalline film with almost no crystal defects can be prepared.

After the step (E) of peeling, the surface of the monocrystalline film 15 on the handle substrate 12 may be preferably smoothened. Thereby, when the substrate 12 having the surface of the monocrystalline film 15 smoothened is subsequently used as the donor substrate, the crystal defects in the monocrystalline layer to be grown can be effectively reduced. By smoothening the surface of the monocrystalline film on the handle substrate and subsequently growing the monocrystalline layer on the smoothened surface of the monocrystalline film as the donor wafer, a smooth monocrystalline layer having fewer crystal defects can be formed.

As shown by the steps (f) and (g) in FIG. 2, in the present invention, a monocrystalline layer 16 can be grown on the substrate 12 having the monocrystalline film 15 with desired crystal defect density obtained by repeating the steps (A) to (E) shown in FIG. 1. By growing the monocrystalline layer on the monocrystalline film having almost no crystal defects prepared by the method according to the present invention, a high-quality monocrystalline layer having almost no dislocation defects can be formed. The prepared substrate 12 having the monocrystalline layer 16 may be preferably subjected to an annealing treatment. Thereby, the surface of the monocrystalline layer 16 can be smoothened and further homogenized so that crystal defects can be reduced. When a monocrystalline silicon layer is used, for example, 1100 to 1300° C. for one to ten hours may be applied to reduce crystal defects.

As shown by the steps (g) to (i) in FIG. 2, the monocrystalline layer 16 formed on the substrate 12 having the monocrystalline film 15 prepared by the method according to the present invention can be formed to have a sufficient thickness. Accordingly, by forming an ion-implanted layer 14 in the monocrystalline layer 16 and peeling, a self-sustained monocrystalline film 17 can be prepared. The thickness of the self-sustained film is not particularly limited and may be, for example, 1 to 1000 µm. The self-sustained monocrystalline film 17 thus prepared can have almost no crystal defects and have high smoothness. Further by annealing the self-sustained monocrystalline film 17, the monocrystalline film can have a further smoothened surface or surfaces and be further homogenized so that crystal defects can be reduced. When a monocrystalline silicon layer is used, for example, 1100 to 1300° C. may be applied to reduce crystal defects.

Furthermore, any one of the substrate comprising the monocrystalline film, the substrate comprising the monocrystalline layer and the self-sustained monocrystalline film prepared by the method according to the present invention can be used as the seed substrate for epitaxial growth or bulk crystal growth.

The monocrystalline film, the monocrystalline layer and the self-sustained monocrystalline film obtained by the method according to the present invention have almost no crystal defects. Accordingly, by using the substrate comprising the monocrystalline film, the substrate comprising the monocrystalline layer and the self-sustained monocrystalline film as the seed substrate, almost no crystal defects due to the defects of the seed substrate surface occur during epitaxial growth or bulk crystal growth. Therefore, a monocrystal having almost no crystal defects can be grown.

As described above, according to the method for preparing a monocrystalline film of the present invention, only the upper layer portion of the grown monocrystalline layer having a relatively few crystal defects can be transferred to a substrate to form a monocrystalline film on or above the substrate. By further growing a monocrystalline layer on the monocrystalline film of the substrate, the monocrystalline layer having fewer crystal defects can be formed. By repeating such steps according to the present invention, the crystal defects in the monocrystalline layer can be further reduced and finally, a substrate comprising a monocrystalline film with extremely few crystal defects can be prepared. In addition, when the thus obtained substrate is used as a seed substrate, a monocrystalline layer, a monocrystalline film and a monocrystal, each having practically no crystal defects, can be obtained.

EXAMPLES

The present invention will be described further specifically below referring to the examples. However, it should not be construed that the present invention is limited thereto.

Example 1

A substrate having a diamond film was prepared according to the steps shown in FIG. 1.

In the step (A) in FIG. 1, silicon monocrystalline substrates each having a diameter of 6 inches (150 mm) and a thickness of 625 µm were provided as a donor substrate 11 and a handle substrate 12. The prepared handle substrate 12 had a surface roughness (Ra) of 0.3 nm, measured by using an atomic force microscope (AFM).

In the step (B) in FIG. 1, the donor substrate 11 was placed in a 2.45 GHz microwave plasma apparatus, and plasma CVD was performed under the conditions of 30 Torr (4,000 Pa) and 850° C., while flowing hydrogen gas containing 2% by volume methane. As a result, a diamond layer 13 was grown to have a thickness of 15 µm.

In the step (C) in FIG. 1, a dose of $5 \times 10^{17}/cm^2$ of hydrogen ions was implanted into the diamond layer 13 grown on the donor substrate 11 so that an ion-implanted layer 14 was formed at a depth of 500 nm from the surface.

In the step (D) in FIG. 1, the donor substrate 11 was closely attached to the handle substrate 12, and heated to 250° C. using an infrared lamp to bond them strongly.

In the step (E) in FIG. 1, the bonded substrates were subjected to heat treatment at 600° C. to peel off at the hydrogen-ion implanted layer. A silicon monocrystalline substrate 12 comprising a diamond film 15 having a thickness of 500 nm was prepared.

Using the thus prepared silicon monocrystalline substrate 12 comprising a diamond film 15 as a donor substrate, and repeating the above steps (A) to (E) three times, obtained was a substrate comprising a diamond film which was found to have no crystal defect based on cross-sectional observations (magnification: 100,000) by using a transmission electron microscope (TEM).

Thereafter, in the steps (f) and (g), in the same manner as in the step (B) of Example 1, a diamond layer having a thickness of 16 µm was grown on the diamond film 15 of the substrate 12, and was subjected to an annealing treatment at 1,200° C. for 3 hours. The silicon substrate comprising the diamond layer thus obtained was suitable to a power transistor having high breakdown voltage.

Example 2

In the step (A) in FIG. 1, a synthesized quartz substrate having a diameter of 4 inches (100 mm) and a thickness of 400 µm was provided as a donor substrate 11. An AlN buffer layer having a thickness of 1 µm was laminated by reaction sputtering on the synthesized quartz substrate substrate. A sapphire substrate having a diameter of 4 inches (100 mm) was provided as a handle substrate 12. The handle substrate 12 had a surface roughness (Ra) of 0.38 nm, measured by an atomic force microscope (AFM).

In the step (B) in FIG. 1, a GaN monocrystalline layer 13 having a thickness of 8 µm was grown on the surface of the buffer layer on the donor substrate 11 in the HVPE (hydride vapor phase epitaxial) method using ammonia and gallium chloride in the presence of hydrogen as a carrier gas at 1,050° C. under an atmospheric pressure.

In the step (C) in FIG. 1, a dose of $9 \times 10^{16}/cm^2$ of hydrogen ions were implanted into the GaN monocrystalline layer 13 grown on the donor substrate 11 so that an ion-implanted layer 14 was formed at a depth of 800 nm from the surface.

In the step (D) in FIG. 1, the surface of the GaN monocrystalline layer 13 on the donor substrate 11 and the surface of the handle substrate 12 were subjected to a plasma treatment using the gases for plasma ($Ar/N_2$), and thereafter, closely attached and heated to 180° C. using an electric heater to bond them strongly.

In the step (E) in FIG. 1, the bonded substrates were peeled at the hydrogen ion implanted layer using a spatula and a vacuum chuck to obtain a sapphire substrate 12 comprising a GaN monocrystalline film 15 with a thickness of 800 nm.

The dislocation density of the GaN monocrystalline film 15 on the sapphire substrate 12 (handle substrate) after peeling was $2 \times 10^4/cm^2$ and the dislocation density of the GaN monocrystalline film 15 on the synthesized quartz substrate 11 (donor substrate) was $8 \times 10^8/cm^2$. The dislocation density of the GaN monocrystalline film 15 which had been the upper layer portion of the monocrystalline layer 13 before peeling was by far lower than the dislocation density of the lower portion of the monocrystalline of the monocrystalline layer 13. The dislocation density means the number of dislocations which penetrate through an area of 1 cm$^2$ of the monocrystalline film and was calculated based on the TEM pictures.

Using the thus prepared sapphire substrate 12 comprising a GaN monocrystalline film 15 as a donor substrate, and repeating the above steps (A) to (E) four times, a substrate comprising a GaN monocrystalline film having a practically zero dislocation density was obtained.

Thereafter, in the steps (f) and (g) in FIG. 2, in the same manner as in the step (B) of Example 2, a GaN monocrystalline layer 16 having a thickness of 7 μm was grown on the GaN monocrystalline film 15 of the substrate 12. As a result, a substrate comprising a GaN monocrystalline layer 16 having an almost zero dislocation density was obtained.

Further in the steps (g) to (i) in FIG. 2, ions were implanted in the GaN monocrystalline layer 16 of the prepared sapphire substrate 12 in the same manner as in the step (C) of Example 2 to form an ion implanted layer 14 except that the ion planted layer 14 was formed at the depth of 2,000 nm from the surface. Thereafter, in the same manner as in the step (E), the substrate was peeled at the ion implanted layer 14 to produce a self-sustained monocrystalline film 17 formed of only GaN monocrystals having a thickness of 2,000 nm. With respect to the self-sustained monocrystalline film 17 thus obtained, no crystal defects and warpages were observed. The self-sustained monocrystalline film 17 was suitable to a substrate for blue laser.

The thus obtained self-sustained monocrystalline film 17 of GaN having a thickness of 2,000 nm was placed as a seed substrate in a high-pressure autoclave together with 0.3 g of 6-N metallic gallium, 10 g of 5-N sodium azide and 40 g of 5-N ammonia. Crystals were grown at 500° C. for 10 days. As a result, a GaN bulk monocrystal of about 1 mm with almost no crystal defects was grown. When a HEMT (high electron mobility transistor) was prepared using a substrate cut from the GaN bulk monocrystal, the high-frequency characteristics thereof were extremely excellent.

As described above, according to the method of the present invention, the crystal defects of the monocrystalline film can be reliably reduced, and finally, even a monocrystalline film with almost no crystal defects can also be obtained. Furthermore, a substrate comprising the thus obtained monocrystalline film is the most suitable as the seed substrate for epitaxial growth or bulk crystal growth.

The present invention is not limited to the above-described embodiments. The above-described embodiments are only examples, and anything that has substantially the same configurations as the technical idea described in the claims, and exerts the equivalent operation effects is included in the scope of the present invention.

The invention claimed is:

1. A method for preparing a substrate comprising a monocrystalline film formed on or above a handle substrate, the method comprising:
    a step A of providing a donor substrate and the handle substrate;
    a step B of growing a monocrystalline layer on the donor substrate;
    a step C of implanting ions into the monocrystalline layer on the donor substrate so as to form an ion-implanted layer;
    a step D of bonding a surface of the monocrystalline layer of the ion-implanted donor substrate to a surface of the handle substrate; and
    a step E of peeling the bonded donor substrate at the ion-implanted layer existing in the monocrystalline layer so as to form the monocrystalline film on or above the handle substrate;
    wherein at least the steps A to E are repeated by using the handle substrate having the monocrystalline film formed thereon or thereabove as a donor substrate.

2. The method for preparing a substrate comprising a monocrystalline film according to claim 1, wherein said step E of peeling comprises peeling the bonded donor substrate at the ion-implanted layer by using a heat treatment or mechanical means.

3. The method for preparing a substrate comprising a monocrystalline film according to claim 1 or 2, wherein said step C of implanting comprises implanting hydrogen ions and/or noble gas ions.

4. The method for preparing a substrate comprising a monocrystalline film according to claim 1, wherein said step D of bonding comprises bonding the surface of the monocrystalline layer which the surface has been smoothened to the surface of the handle substrate.

5. The method for preparing a substrate comprising a monocrystalline film according to claim 1, wherein a surface of the monocrystalline film on or above the handle substrate obtained in said step E of peeling is smoothened after said step E.

6. The method for preparing a substrate comprising a monocrystalline film according to claim 1, wherein said step B of growing comprises a chemical vapor deposition (CVD) process, a physical vapor deposition (PVD) process or a liquid phase epitaxial growing process.

7. The method for preparing a substrate comprising a monocrystalline film according to claim 1, wherein said donor substrate or said handle substrate comprises silicon, sapphire, SiC, GaN, AlN or zinc oxide.

8. The method for preparing a substrate comprising a monocrystalline film according to claim 1, wherein said step A of providing comprises providing the handle substrate being selected from the group consisting of an amorphous substrate, a polycrystalline substrate and a monocrystalline substrate, and having surface roughness (Ra) of 0.5 nm or less for the surface to be bonded in the step D.

9. The method for preparing a substrate comprising a monocrystalline film according to claim 1, wherein said step A of providing comprises providing the donor substrate and/or the handle substrate comprising one or more buffer layers selected from the group consisting of $SiO_2$, $Si_3N_4$, GaN, AlGaN, InGaN, AlN and combinations thereof.

10. The method for preparing a substrate comprising a monocrystalline film according to claim 1, wherein said step B of growing comprises growing the monocrystalline layer of any of silicon, SiC, GaN, AlN, zinc oxide and diamond.

11. The method for preparing a substrate comprising a monocrystalline film according to claim 1, wherein said step D of bonding comprises bonding said surface of the monocrystalline layer to said surface of the handle substrate, one or both of said surfaces having been subjected to a plasma treatment.

12. A method for preparing a substrate comprising a monocrystalline layer thereon, comprising a step of growing a monocrystalline layer on a monocrystalline film on the substrate prepared in the method according to claim 1.

13. The method for preparing a substrate comprising a monocrystalline layer according to claim 12, further comprising a step of annealing the substrate comprising the grown monocrystalline layer.

14. A method for preparing a self-sustained monocrystalline film, comprising steps of:
  implanting ions into the monocrystalline layer of the substrate prepared in the method according to claim 12 or 13 so as to form an ion-implanted layer, and
  peeling at the ion-implanted layer to obtain the self-sustained monocrystalline film.

15. The method for preparing a self-sustained monocrystalline film according to claim 14, further comprising a step of annealing said self-sustained monocrystalline film obtained in said step of peeling.

16. A method for preparing a monocrystal, comprising a step of using the substrate comprising a monocrystalline film, the substrate comprising a monocrystalline layer, or the self-sustained monocrystalline film prepared in the method according to claim 1 as a seed substrate for epitaxial growth or bulk crystal growth.

* * * * *

UNITED STATES PATENT AND TRADEMARK OFFICE
CERTIFICATE OF CORRECTION

PATENT NO. : 8,030,176 B2
APPLICATION NO. : 12/380090
DATED : October 4, 2011
INVENTOR(S) : Yoshihiro Kubota et al.

It is certified that error appears in the above-identified patent and that said Letters Patent is hereby corrected as shown below:

On the Title page Item (75), "Annaka-Shi" should read --Gunma-Ken--.
Column 2, line 46, "invention is also" should read --invention also--.
Column 4, line 44, delete the "," between "least" and "one".
Column 8, line 50, "were" should read --was--.

Signed and Sealed this
Nineteenth Day of March, 2013

Teresa Stanek Rea
*Acting Director of the United States Patent and Trademark Office*